United States Patent [19]

Beinglass et al.

[11] 4,446,613
[45] May 8, 1984

[54] INTEGRATED CIRCUIT RESISTOR AND METHOD OF FABRICATION

[75] Inventors: Israel Beinglass, Santa Clara; Nan-Hsiung Tsai, Fremont, both of Calif.

[73] Assignee: Intel Corporation, Santa Clara, Calif.

[21] Appl. No.: 312,771

[22] Filed: Oct. 19, 1981

[51] Int. Cl.³ .................. H01L 29/00; H01C 17/00
[52] U.S. Cl. .......................................... 29/571; 29/578; 29/576 W; 156/653; 156/648; 357/59
[58] Field of Search ............... 29/571, 576 B, 578; 357/59, 71, 51; 156/653, 648

[56] References Cited

U.S. PATENT DOCUMENTS 4,075,045  2/1978  Rideout .................... 156/653 X
4,128,845  12/1978  Sakai ........................ 357/55 X

OTHER PUBLICATIONS

Okada et al., IEEE J. of Solid-State Circuits, vol. SC13, No. 5, Oct. 1978, pp. 693-698, abandoned application Ser. No. 06/236652 Tsai, Filed 2/23/81.

Primary Examiner—Brian E. Hearn
Assistant Examiner—David A. Hey
Attorney, Agent, or Firm—Blakely, Sokoloff, Taylor & Zafman

[57] ABSTRACT

A process for forming a resistor structure which comprises a polysilicon strip having a resistor region with tungsten leads formed on opposite ends of the strip. A protective oxide is grown on the sides of the silicon strip preventing undercutting of the oxide layer disposed beneath this strip. This prevents formation of the tungsten under the strip or along the sides of the strip which would otherwise place stress on the strip in addition causing other problems.

5 Claims, 21 Drawing Figures

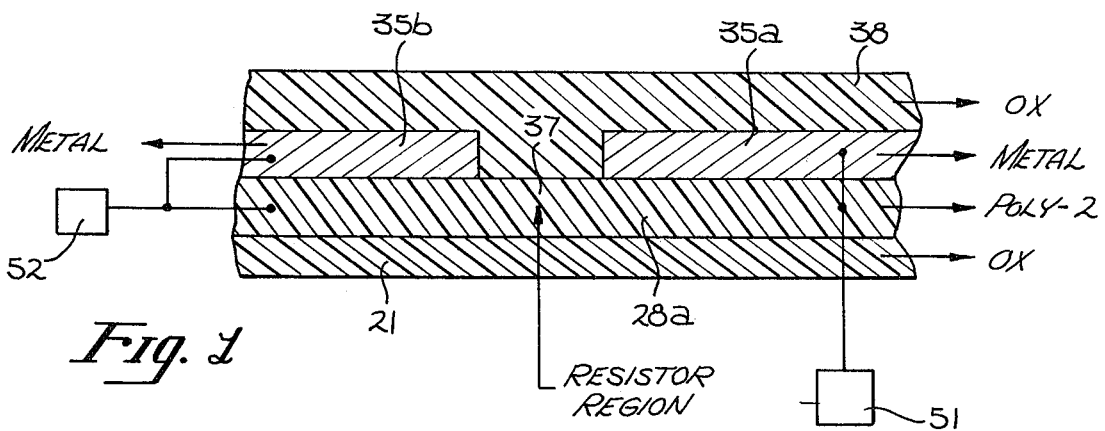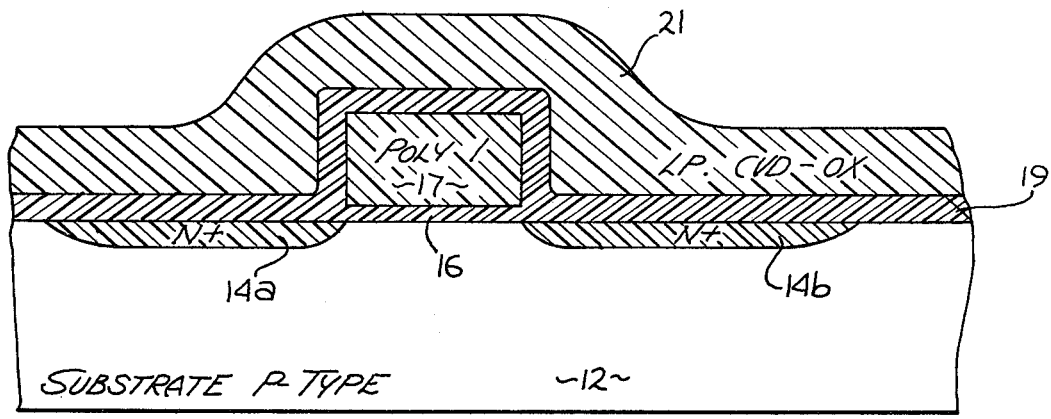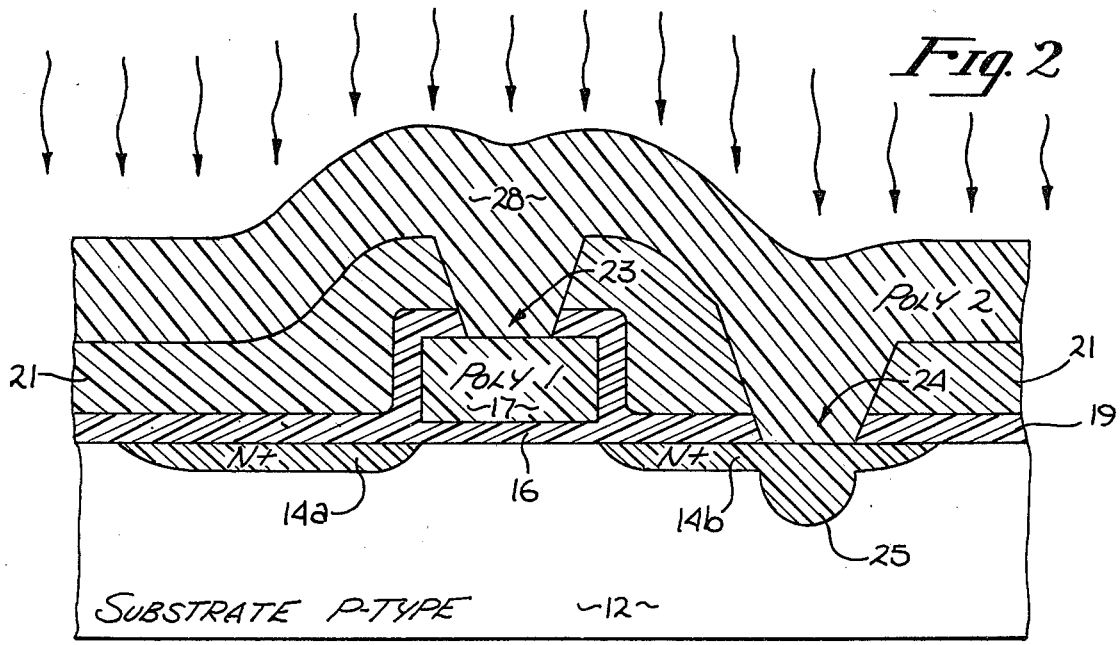

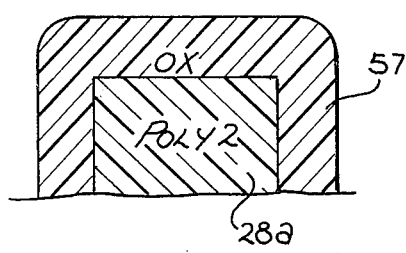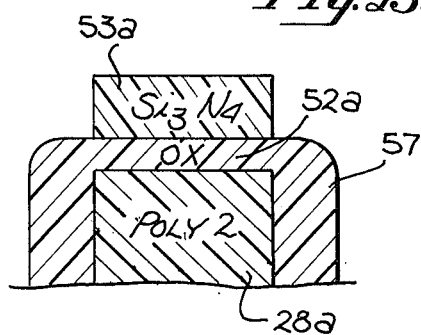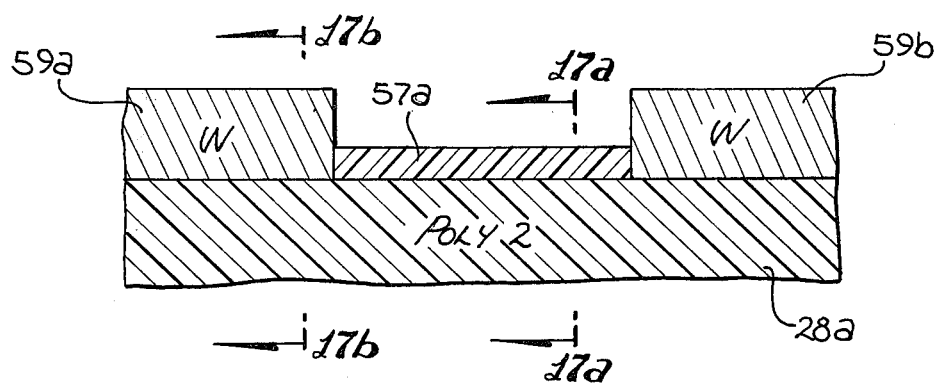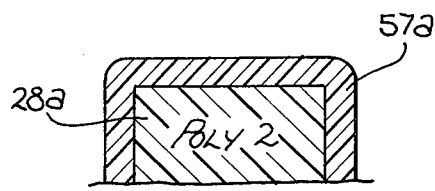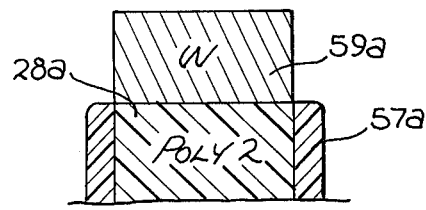

INTEGRATED CIRCUIT RESISTOR AND METHOD OF FABRICATION

BACKGROUND OF THE INVENTION

1. Field of the Invention.

The invention relates to the field of integrated circuit resistors.

2. Prior Art

In the fabrication of integrated circuits, resistors are often needed. In some cases materials having relatively high resistance such as polysilicon are used. Active devices having low conductivity are also used for resistors. In the fabrication of metal-oxide-semiconductor (MOS) static, random-access memories (RAMs), polysilicon resistors are often employed as loads in the bistable (flip-flop) memory cells.

In U.S. Pat. No. 4,178,674, a process is described for forming a contact region between layers of polysilicon with an integral polysilicon resistor. This resistor includes a resistor region with low resistance areas connected to the region. The resistor is formed by first doping a strip of polysilicon to a first concentration level, this level providing the desired resistivity for the resistor region. Then a masking member is placed over the resistor region and the polysilicon is doped to a second higher level to increase its conductivity to form low resistance regions (leads) on opposite sides of the resistor region.

In the formation of resistors, such as the one described in U.S. Pat. No. 4,178,674, it is desirable to reduce the resistance associated with conductive regions (leads) connected to the resistor region. With a low resistance in these regions, the circuit can operate at a faster rate. The conductive regions are heavily doped (e.g., with phosphorus or arsenic) to reduce the resistance in some cases. However, these dopants have a relatively long diffusion length in polysilicon (approximately 6.5 microns for phosphorus). If a resistor region of approximately 5 microns in length is required, the total length of the polysilicon must be at least approximately 18 microns because of the lateral diffusing of the dopant into the resistor regions from the conductive regions. Thus, considerable lengths are required for these polysilicon resistors when considered in terms of high density integrated circuits.

As will be seen, the present invention provides a resistor and method of fabrication which greatly reduces the total size of the resistor with its conductive regions. High doping of the polysilicon is not used to reduce the resistance of the conductive regions. For this reason, the problems associated with the lateral diffusion from the conductive regions are greatly reduced.

SUMMARY OF THE INVENTION

A process for fabricating an integrated circuit resistor on a first insulative layer such as a silicon dioxide layer is described. First, a strip of polysilicon is formed on the insulative layer using an overlying silicon nitride member as a masking member. A portion of the silicon nitride member is removed from the strip of polysilicon overlying a predetermined region of this strip. Next, an oxide layer is grown on the strip at regions unprotected by the silicon nitride member. Oxide is grown at least on the sides of the strip. Now the remaining portions of the silicon nitride member are removed and metal members are formed over opposite ends of the strip with no metal being formed over the predetermined region of the strip. In this manner, the predetermined region of the strip of polysilicon forms a resistor region and the metal members form low resistance leads for this region. In the presently preferred embodiment, tungsten members are formed on the strip.

BRIEF DESCRIPTION OF THE DRAWINGS

FIG. 1 is a cross-sectional elevation view of the invented resistor structure with its integral conductive regions.

FIG. 2 is a cross-sectional elevation view of a substrate which includes a gate member and source and drain regions with overlying oxide layer.

FIG. 3 illustrates the substrate of FIG. 2 with openings formed through the oxide layers to expose the gate member and one region in the substrate, and with a second layer of polysilicon formed over the oxide layers.

FIG. 5b is a plan view of the structure of FIG. 5a.

FIGS. 13-17b illustrate alternate processing intended to avoid the problem illustrated in FIG. 12.

FIG. 13 is a cross-sectional elevation view of a strip formed from the second oxide layer of polysilicon shown in FIG. 3 with an overlying oxide layer, silicon nitride layer and photoresist layer with an opening formed in the photoresist layer.

FIG. 14 illustrates the polysilicon strip of FIG. 13 after additional etching steps.

FIG. 15 is a cross-sectional end view of the structure of FIG. 14 after an oxide growing step. This view is generally taken through section line 15—15 of FIG. 14.

FIG. 15b is a cross-sectional end view of the structure of FIG. 14 after an additional oxidation step. This view is generally taken through section line 15b—15b of FIG. 14.

FIG. 16 is a cross-sectional elevation view of the resistor structure of FIG. 15a and 15b after additional etching steps and a metallization step.

FIG. 17a is a cross-sectional end view used to illustrate the resistor structure of FIG. 16. This view is generally taken through section line 17a—17a of FIG. 16.

FIG. 17b is a cross-sectional end view of the resistor structure of FIG. 16, generally taken through section line 17b—17b of FIG. 16.

DETAILED DESCRIPTION OF THE INVENTION

Figure 4:
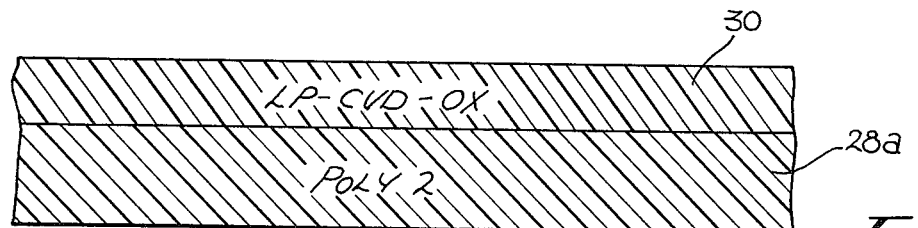
FIG. 4 is a cross-sectional elevation view of a strip formed from the second layer of polysilicon shown in FIG. 3 with an overlying oxide layer.

An integrated circuit resistor which includes a resistor region and high conductivity regions connected to the resistor region is described. Also, the preferred method of fabricating the invented resistor is described. In the following description, numerous specific details are set forth such as specific conductivity types, thicknesses of layers, dopant concentration, etc., in order to provide a thorough understanding of the present invention. It will be obvious to one skilled in the art, however, that the present invention may be practiced without these specific details. In other instances, well-known processing steps and integrated circuit structures have not been described in detail in order not to obscure the present invention in unnecessary detail.

Referring first to FIG. 1, the resistor of the present invention includes an elongated polysilicon member 28a. At least the resistor region 37 of the elongated polysilicon member is doped to a predetermined level so as to provide a predetermined resistance for the region 37.

The conductivity regions leading to and from the resistor region 37 have reduced resistance because of the overlying metal members 35a and 35b. One metal member 35a extends along one end of the strip 28a to the region 37, while the other member 35b extends along the opposite end of this strip 28a to the opposite end of the region 37. Both metal members 35a and 35b are in electrical contact with the strip 28a and thus act as lead for the resistor region 37. In the presently preferred embodiment, the members 35a and 35b comprise tungsten.

The polysilicon strip 28a is formed on an insulative layer such as the silicon dioxide layer 21 and an additional oxide layer 38 extends over the members 35a and 35b and in contact with the polysilicon member 28a at the region 37.

For purposes of illustration, a contact 51 is shown contacting one end of the strip 28a and the metal member 35a, while another contact 52 contacts the other end of the strip 28b and the metal contact member 35b. In practice, contact is made to the metal members 35a and 35b from overlying layers and contact to the polysilicon strip 28a is made with buried contacts which contact substrate regions of polysilicon structures.

Referring now to FIG. 2, a portion of a substrate 12 is illustrated after certain well-known processing. In the presently preferred embodiment, a low resistivity (50 ohm cm) monocrystalline substrate is employed. After the growing of the gate oxide layer 16, to a thickness of approximately 250 A, a first layer of polysilicon is formed over the gate oxide layer. Polysilicon members such as gate member 17 are defined from this layer. Then, source and drain regions such as regions 14a and 14b are formed in alignment with the gate member. In the presently preferred embodiment, the layer of polysilicon is approximately 3000 A thick and doped with a phosphorus dopant to a level of 40 ohm/sq. The source and drain regions are formed by ion implanting arsenic to a level of approximately $10^{20}/cm^3$.

The substrate is then subjected to a re-oxidation step to form the thicker silicon dioxide layer 19 of approximately 500 A. A thicker silicon dioxide layer 21 of approximately 3000 A is now deposited over the substrate (layer 19). In the presently preferred embodiment, this silicon dioxide layer is formed with a low pressure, chemical vapor deposition process. (LP-CVD).

Referring now to FIG. 3, using an ordinary photolithographic step, openings 23 and 24 are formed through the layers 19 and 21 to expose portions of the gate member 17 and region 14b. Then the substrate is subjected to a phosphorus doping step to form the plug region 25 as is well-known in the art.

Next a second layer 28 of polysilicon is formed over the substrate. This layer is in contact with the gate member 17 at the opening 23 and the region 14b at the opening 24. In the presently preferred embodiment, the layer is approximately 2000 A thick. As shown in FIG. 2, the polysislicon layer 28 is subjected to a sheet implant with arsenic ions to dope the layer to a level of approximately $4\times 10^{13}/cm^2$. This concentration level to a large extent determines the resistivity of the resistor region which is subsequently formed from the polysilicon layer 28.

Referring now to FIG. 4, an elongated polysilicon strip 28a formed from the layer 28 of FIG. 3 is illustrated after a layer 30 of silicon dioxide has been formed over the substrate including the strip 28a. Ordinary photolithographic techniques are used to define members from the polysilicon layer; in the presently preferred process, plasma etching is employed. As presently preferred, the oxide layer 30 is approximately 1500 A thick and is formed by a low pressure, chemical vapor deposition process.

Figure 5A:
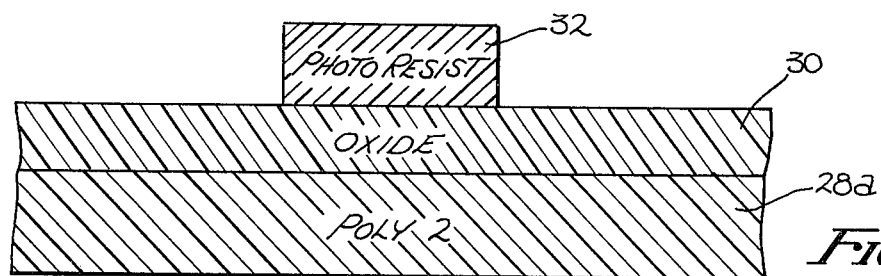
FIG. 5a is a cross-sectional elevation view illustrating the polysilicon strip and oxide layer of FIG. 4 with a masking member.
Figure 5B:
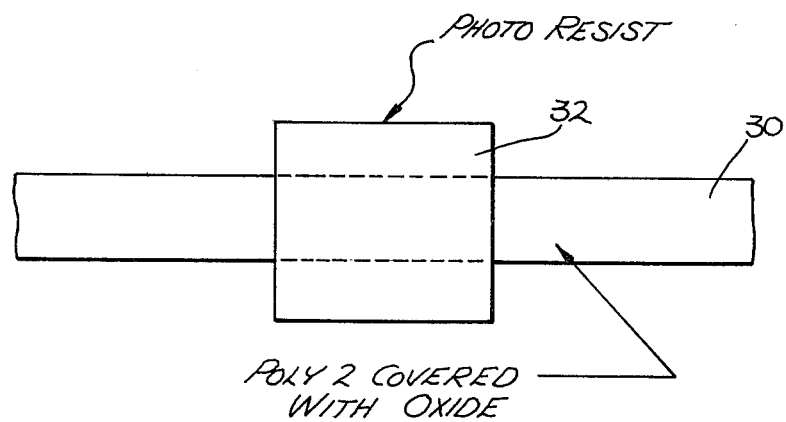

Referring now to FIGS. 5a and 5b, a photoresist layer is formed over the substrate, and then employing ordinary photolithographic techniques, a masking member 32 is defined over the strip 28a on oxide layer 30. The dimension of this masking member along the strip 28a substantially determines the length of the resistor region which is to be formed within the strip 28a.

Figure 6A:
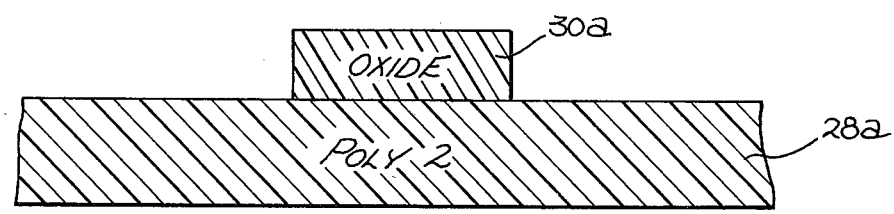
FIG. 6a illustrates the structure of FIG. 5a with the oxide layer etched.
Figure 6B:
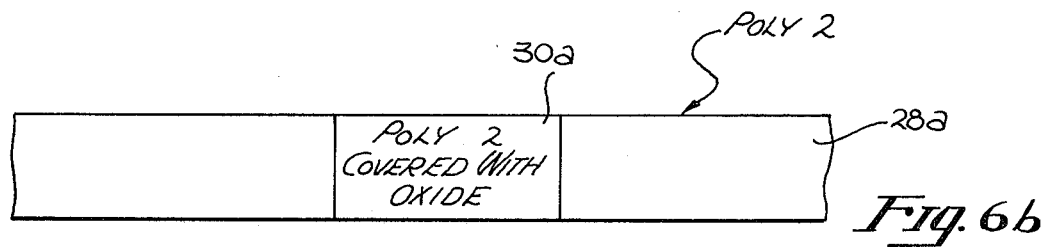
FIG. 6b illustrates the structure of FIG. 6a in plan view.

With the masking member 32 in place, the substrate is subjected to an etching step to etch away the layer 30 except under the masking member 32. The resultant structure is shown in FIGS. 6a and 6b after the masking member 32 has been removed. The structure consists of the elongated polysilicon strip 28 and an oxide member 30a disposed over a region of the polysilicon strip.

Figure 7:
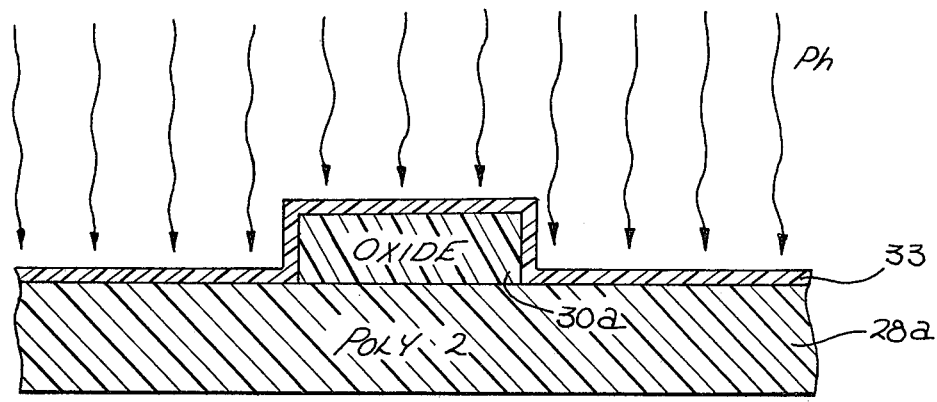
FIG. 7 illustrates the structure of FIG. 6a during a doping step.

Referring to FIG. 7, in the presently preferred embodiment, the substrate (including the polysilicon strip) is subjected to a relatively light phosphorus doping step. The polysilicon is doped to a level of approximately 40-50 ohm/sq. The dopant introduced during this step is not sufficient to cause substantial lateral diffusion under the oxide member 30a and thus, unlike the prior art resistor described in U.S. Pat. No. 4,178,674, the polysilicon strip 28a can be substantially shorter. However, it has been found that this additional doping step improves the contact resistance between the polysilicon strip 28a and the metal members 35a and 35b which are subsequently formed over portions of the strip. Also, this doping step improves the conductivity of the polysilicon in the region of the buried contacts, such as the contacts with substrate regions.

Referring briefly again to FIG. 7, during the phosphorus diffusion steps, a thin oxide layer 33 forms over the substrate including the strip 28a; this oxide layer 33 is removed with an etching step, (e.g., HF dip).

Figure 8:
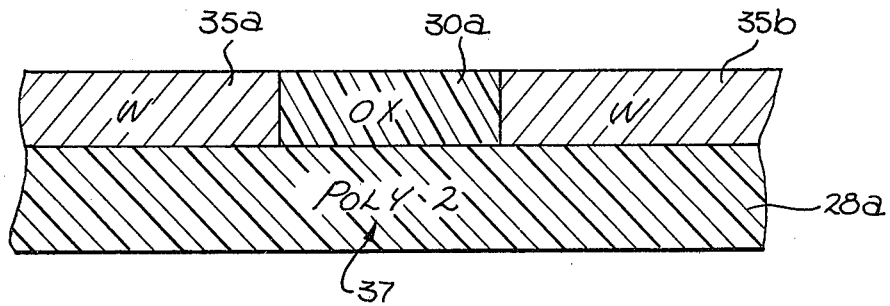
FIG. 8 illustrates the structure of FIG. 7 with metal members formed over exposed regions of the polysilicon strip.

As shown in FIG. 8, metal is formed over the polysilicon strip 28a except in the region of the oxide member 30a. In the presently preferred embodiment, a commercially available chemical vapor deposition process available from AMT Corporation, is employed. With is process, tungsten is formed over the exposed polysilicon, however, the tungsten does not form over silicon dioxide, or for that matter, over silicon nitride. Thus, with this process, the tungsten members 35a and 35b are formed only over the strip 28a. Note that in addition to the oxide member 30a over region 37 of the polysilicon strip 28a, the layer 21 of FIG. 2 is exposed in other areas of the substrate and this oxide layer prevents the formation of tungsten in these other regions. In the presently preferred embodiment, the metal members 35a and 35b are approximately 1500 A–2000 A thick.

Other metals may be used for members 35a and 35b. For example, an aluminum/copper alloy may be used, although deposition in alignment with the strip 28a is not currently possible with this alloy. Where the aluminum/copper alloy is employed, preferably a layer of this alloy is formed over the layer of polysilicon after the arsenic sheet implant described above. The polysilicon line 28a is formed with its overlying metal line by first etching the metal. An additional metal masking step is then used to remove the metal over the region 37 of the strip 28a.

Figure 9:
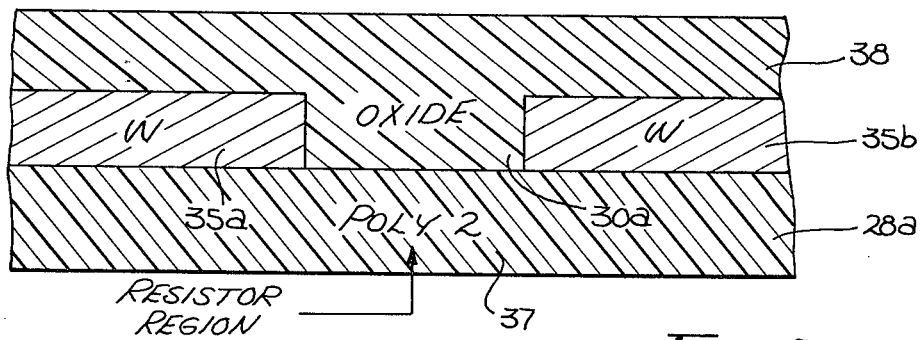
FIG. 9 illustrates the structure of FIG. 8 with an additional oxide layer.

Referring now to FIG. 9, in the presently preferred embodiment, following the deposition of the tungsten an additional oxide layer 38 is formed over the substrate including the metal members 35a and 35b and the oxide member 30a. Again, this layer is formed employing a low pressure, chemical vapor deposition process which deposits silicon dioxide.

Figure 10:
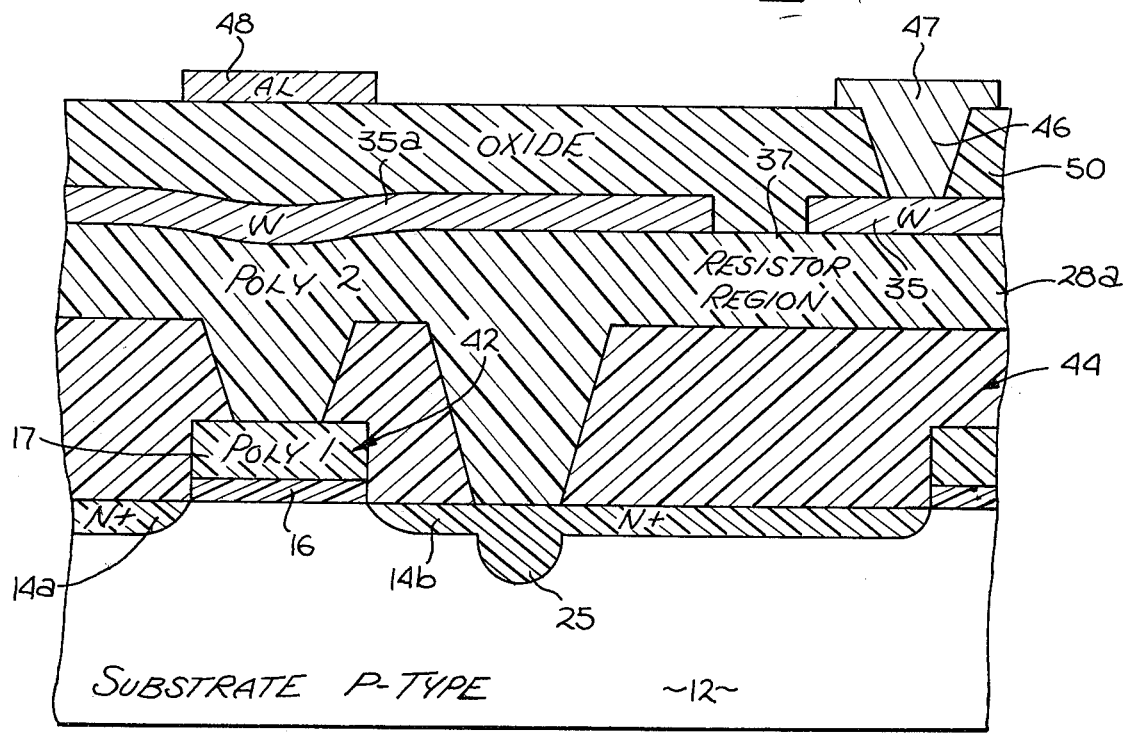
FIG. 10 is a cross-sectional elevation view of a substrate which includes a pair of transistors and a resistor in accordance with the present invention.

Referring briefly now to FIG. 10, the resistor of FIGS. 1 and 9 is shown in an integrated circuit. A transistor 42 which includes the regions 14a and 14b and the gate members 17 is illustrated along with a portion of an additional transistor 44. The region 14b extends to the edge of the gate member of the transistor 44. A metal contact 46 extends from the metal line 47 into contact with the metal member 37b. The contact 46 extends through a layer 50 which may include the layer 38 of FIG. 9 and other protective layers frequently used. An additional metal line 48 is also illustrated. In the electrical equivalent of FIG. 10 (FIG. 11) resistor region 37 is shown as a resistor with leads 35a and 35b. Lead 35a is coupled to the gate and source of transistor 42, and to one terminal of transistor 44.

Figure 11:
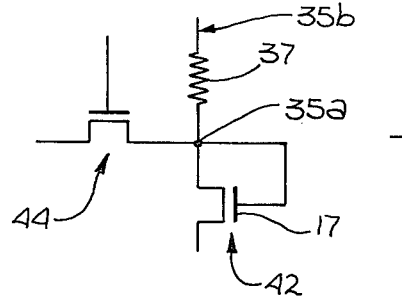
FIG. 11 is an equivalent circuit in electrical schematic form, for the structure of FIG. 10.

FIGS. 10 and 11 are used to show but one possible interconnection formed with the resistor region and its low resistance regions of the present invention. It will be obvious to one skilled in the art that the resistor of the present invention may be used in numerous other circuits.

Figure 12:
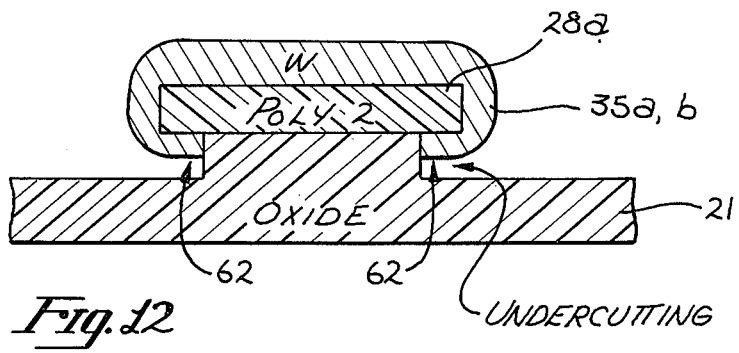
FIG. 12 is a cross-sectional elevation view of a portion of the invented resistor structure fabricated in accordance with the teachings of FIGS. 3 through 9. This drawing is used to illustrate a possible problem that may result.

It has been found that during the fabrication of a resistor structure as described above, a problem may result. In particular, during the etching of the polysilicon strip 28a from the layer 28 shown in FIGS. 3 and 4 and in the etching steps associated with FIGS. 5a and 6a, undercutting of the polysilicon strip 28a can occur. This undercutting is shown in FIG. 12 as an erosion of the oxide beneath the strip 28a. When the metal such as tungsten is formed over the selected portions of the polysilicon strip some metal is formed under the strip, again as shown in FIG. 12 at regions 62. This places a mechanical stress of the strip of polysilicon which may cause it to lift. Moreover, voids occur in the undercut region which are not filled by overlying dielectrics. The presence of voids may cause additional problems such as corrosion.

In FIGS. 13 through 17b, alternate processing is described which prevents the undercutting. The steps discussed in conjunction with FIGS. 2 and 3 are performed including the implantation of the second layer of polysilicon illustrated in FIG. 3. However, the low pressure, chemical vapor deposition of silicon dioxide shown in FIG. 4 is not performed. Rather, a thin oxide layer is grown on the second polysilicon layer 28. For example, the substrate is subjected to a dry oxygen atmosphere at 920 degrees C. for approximately 10 minutes. Then, a layer of silicon nitride of approximately 400 A thick for the presently preferred process is formed over the oxide layer. Now ordinary masking and etching steps are used to define various members from the second layer of polysilicon 28 such as the strip 28a used in the formation of the resistor structure of the present invention. Overlying oxide members and silicon nitride members formed from the oxide layer and silicon nitride layer are used as masking members during the etching of the polysilicon members, and thus remain in place over the polysilicon.

Figure 13:
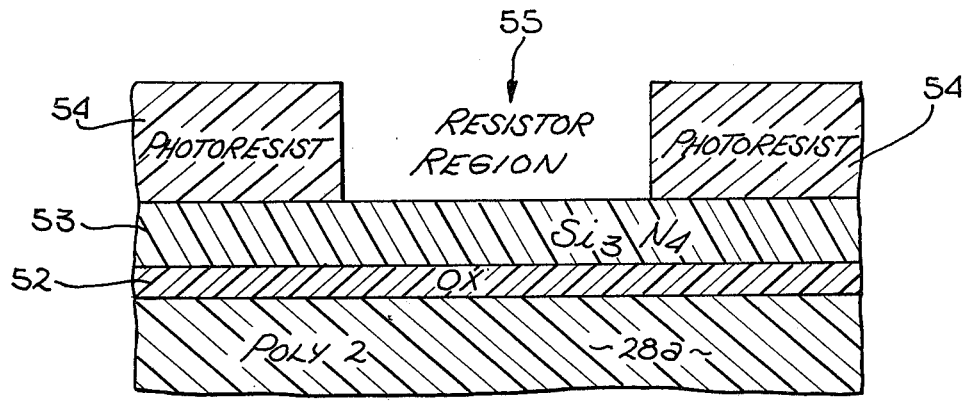

The polysilicon line 28a is illustrated in FIG. 13 with an overlying oxide strip 52 and an overlying silicon nitride strip 53. A photoresist layer 54 is formed over the wafer and an ordinary masking step is used to define openings for the resistor regions such as opening 55. Note this is a departure from the above-described processing and that a reverse field is used to define the resistor region. Note that in FIG. 5a the photoresist member remains over the resistor region while in FIG. 13, the photoresist layer is removed at the resistor region 55.

Figure 14:
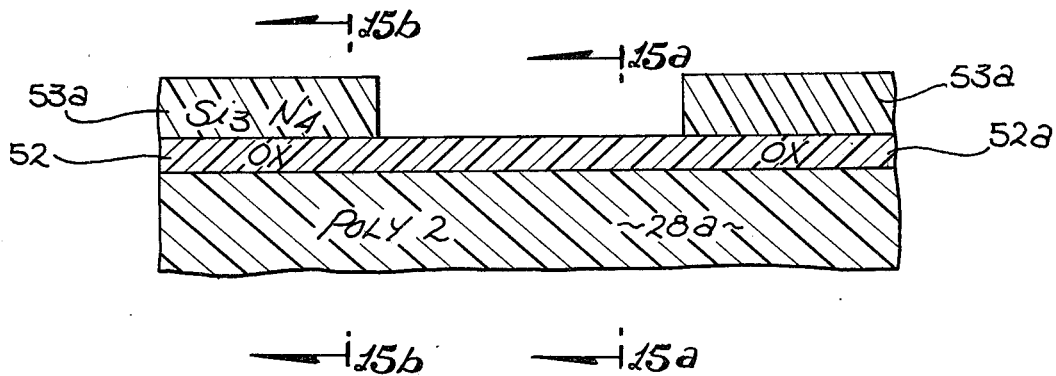

The underlying silicon nitride layer 53 is etched at the opening 55 leaving the remaining members 53a illustrated in FIG. 14. The resultant structure after this etching step is shown in FIG. 14 with a photoresist layer 54 removed.

The substrate is then subjected to an additional oxidation step. Oxide is grown in the resistor region 55 and on the sides of the strip 28a. Note that no oxide grows under the silicon nitride members 53a. The resultant structure is shown in the end views 15a and 15b. In the resistor region, relatively thick oxide 57 is grown around the polysilicon strip 28a. In the lead regions, the oxide layer 57 is relatively thick on the sides of the strip 28a, however, on the upper surface of the strip the thinner layer 52a remains. By way of example, the oxide in this last mentioned oxidation step is grown to twice the thickness of the oxide 52a.

After removal of the remaining silicon nitride, the substrate is subjected to an oxide etchant. An oxide thickness corresponding to layer 52a is removed during this etching step. This exposes the polysilicon on the upper surface of the strip 28a leading to the resistor region. However, since the oxide on the sides of the polysilicon strip is thicker than that under the silicon nitride, the sides of the strip 28a as well as the resistor region of the polysilicon strip remain protected by an oxide layer.

Now metal members are formed on the exposed portions of the strip 28a as described in the above process. Again, in the presently preferred embodiment, tungsten members such as members 59a and 59b are formed as shown in FIG. 16. The resistor region remains covered by an oxide layer 57a which oxide remains after the etching of layer 57. In the cross-sectional view of the resistor region shown in FIG. 17a, it can be clearly seen at the sides and upper surface of the polysilicon strip are covered with oxide 57a in the resistor region. In FIG. 17b the leads to the resistor region are covered with tungsten and again the sides of the polysilicon strip is covered with oxide.

With the above-described alternate processing, the undercutting is eliminated. Moreover, the tungsten is only formed on the upper surface of the polysilicon eliminating stress problems associated with the formation of the metal on the sides of the silicon. Also, when compared to the above described process, a thermally grown oxide is formed over the second layer of polysilicon and this oxide provides better insulation than the chemical vapor deposited oxide. Another advantage to this alternate processing is that the resultant structure is more plainer because of the thermally grown oxide on the second level polysilicon. This helps reduce the metallization problems associated with the metal deposition steps.

In copending application Ser. No. 278,656, filed June 29, 1981, and assigned to the assignee of the present application, other metal covered polysilicon circuit members and processes for forming them, are described.

Thus, an integrated circuit resistor structure and process for forming the structure has been described. The resistor of the present invention includes a polysilicon resistor region and high conductivity regions interconnecting with the resistor region. When compared to prior art polysilicon resistors, the resistor of the present invention requires substantially less substrate area.

We claim:

1. A process for fabricating an integrated circuit resistor on a first insulative layer, comprising the steps of:
   forming a strip of polysilicon on said first insulative layer using an overlying silicon nitride member;
   removing a portion of said silicon nitride member from said strip overlying a predetermined region of said strip;
   growing an oxide layer on said strip at regions unprotected by said silicon nitride member, such that oxide is formed at least on the sides of said strip;
   removing said silicon nitride member; and
   forming metal members over opposite ends of said strip of polysilicon without forming metal over said predetermined region of said strip,
   whereby said predetermined region of said strip of polysilicon forms a resistor region and said metal members form low resistance leads for said resistor region.

2. The process defined by claim 1 wherein said step of forming said metal members comprises the formation of tungsten members.

3. A process for fabricating an integrated circuit resistor on an insulative layer, comprising the steps of:
   forming a layer of polysilicon on said insulative layer;
   growing a first oxide layer on said polysilicon layer;
   forming a silicon nitride layer on said polysilicon layer;
   etching a strip of polysilicon from said polysilicon layer with an overlying oxide member formed from said oxide layer and an overlying silicon nitride member formed from said silicon nitride layer;
   removing a portion of said silicon nitride member at a predetermined region of said strip;
   subjecting said polysilicon strip to an oxidation step such that a second oxide layer is formed on the sides of said strip;
   removing said silicon nitride member;
   removing the portions of said first oxide member underlying said silicon nitride member and spaced-apart from said predetermined region, exposing opposite ends of said polysilicon strip;
   forming metal members over said exposed ends of said strip,
   whereby said predetermined region of said strip of polysilicon forms a resistor region and said metal members form low resistance leads from said resistor region.

4. The process defined by claim 3 wherein said step of forming said metal members comprises the formation of tungsten members.

5. The process defined by claim 4 including the step of ion implanting said polysilicon layer prior to the formation of said silicon nitride layer.

* * * * *